United States Patent
Muffler

(10) Patent No.: US 6,841,027 B2
(45) Date of Patent: Jan. 11, 2005

(54) METHOD FOR APPLYING A SUBSTRATE

(75) Inventor: Pirmin Gerhard Muffler, Orsingen-Nenzingen (DE)

(73) Assignee: Süss MicroTec Laboratory Equipment GmbH, Garching (DE)

( * ) Notice: Subject to any disclaimer, the term of this patent is extended or adjusted under 35 U.S.C. 154(b) by 0 days.

(21) Appl. No.: 09/727,354

(22) Filed: Nov. 30, 2000

(65) Prior Publication Data

US 2002/0062921 A1 May 30, 2002

(51) Int. Cl.[7] ................................................. B29C 65/48
(52) U.S. Cl. ........................ 156/286; 156/285; 438/118
(58) Field of Search ........................ 438/457, 118–119; 156/295, 552, 556, 285–286; 369/286

(56) References Cited

U.S. PATENT DOCUMENTS

| | | | | |
|---|---|---|---|---|
| 3,322,598 A | * | 5/1967 | Marks et al. ................ | 156/382 |
| 3,554,834 A | * | 1/1971 | Bennett et al. .............. | 156/230 |
| 5,284,538 A | * | 2/1994 | Suzuki et al. ................ | 156/154 |
| 5,733,410 A | * | 3/1998 | Gore et al. .................. | 156/542 |
| 6,484,383 B1 | * | 11/2002 | Herklotz ....................... | 29/446 |

FOREIGN PATENT DOCUMENTS

| | | | |
|---|---|---|---|
| DE | 43 32 488 | 5/1996 | |
| JP | 55-2020 | * 1/1980 | ........... B29C/27/10 |
| WO | 99/25019 | 5/1999 | |

* cited by examiner

*Primary Examiner*—Jeff H. Aftergut
*Assistant Examiner*—Jessica Rossi
(74) *Attorney, Agent, or Firm*—Pauley Petersen & Erickson

(57) ABSTRACT

A method for applying a thin-walled, flat substrate, such as a wafer, to an assembly carrier with a preferably level protective layer, for example a wax. With respect to the protective layer, the substrate is arranged at a spacing and is curved in a convex manner. The substrate is contacted with the protective layer. Finally, the substrate is laid over the entire protective layer from the contact point towards the edge of the substrate.

6 Claims, 2 Drawing Sheets

METHOD FOR APPLYING A SUBSTRATE

BACKGROUND OF THE INVENTION

1. Field of the Invention

This invention relates to a method for applying a substrate, such as a wafer to an assembly carrier, and to a device for accomplishing this method.

2. Description of Related Art

In the commercial production of semiconductor wafers, such as slices of silicon, GaAs and the like, a semiconductor wafer is subjected to different successive processes. An important step after applying various structures and layers on a front side, such as an active side or respectively the side on which the applied structures are located, is the attachment of a protective layer on the active side. This layer protects the upper side of the wafer and thus its sensitive surface during the subsequent treatment process, for example thinning the wafer by grinding or lapping. The thinning process takes place on the rear side of the wafer and significantly influences the residual thickness of the wafer.

Because abrading occurs down to a thickness of approximately 50 $\mu$m or less, achieving as flat as possible a surface of the wafer is very important. One parameter for this surface quality is the quality of the wafer substrate which is formed from the assembly carrier and the applied protective layer. Unevenness impairs the rear side of the wafer which is to be processed. Methods for improving the unevenness are known.

PCT International Publication WO 99/25019 describes a special mixture for mounting and disassembling a semiconductor wafer. German Patent Reference DE 43 32 488 discloses a foil attached as flat as possible by adhesive force. Also known are reversible adhesive layers. It has become apparent, that despite expensive preparation of the wafer substrate, there is an inherent disadvantage in the system. Through the introduction of a protective layer between the active side of the wafer and the assembly carrier, air pockets occur which cause unevenness on the rear side of the wafer. These air pockets can scarcely be eliminated by increasing the compressive force or distributing the local pressure locations. Repeating the pressing process several times also does not achieve the desired result. Moreover, the danger of breaking the wafer is increased in an uncontrolled manner by such manipulations.

SUMMARY OF THE INVENTION

One object of this invention is to provide a method and apparatus to connect the wafer to the protective layer without excessive process cost expenses and without any problems, with extensive exclusion of air bubbles.

This object is achieved by the features described in this specification and in the claims.

According to this invention, the wafer, generally a substrate, is with respect to the protective layer first arranged at a spacing and arched in a convex manner. Thereafter the wafer is brought into contact in a linear movement with the protective layer and/or the adhesive layer. Finally, the wafer is laid over the entire area of the protective layer from the first contact point towards the edge of the wafer. This guarantees that, starting from a central point, a homogenous displacement movement occurs between the layers through transformation of the dome-shaped wafer into a flat surface. During this type of procedure, air bubbles rarely occur or are pressed outwards in a radial direction and eliminated.

According to a further embodiment of this invention, the wafer is exposed to almost constant pressure as it is laid onto the protective layer. This ensures a largely constant, uniform and only small depth of penetration of the wafer into the protective layer. This is achieved during the linear approach movement of the pre-shaped wafer towards the protective layer by constantly monitoring the spacing between the two bodies. As soon as the dome-shaped contact point reaches the protective layer, the speed and the spatial shape of the wafer are correspondingly altered so that the surface area of the dome-shaped wafer extends two-dimensionally over the protective layer, without causing significant locally varying depths of penetration.

According to further advantageous method steps, the formation of the convex arching of the wafer and the holding of the wafer by the carrying body and the detachment of the wafer from the same are achieved by controlling the pressure of the medium in the cavity between the wafer and the carrying body. Thus, the amount of the arching can be freely controlled chronologically and spatially in order to guarantee uniform deposition of the wafer on the protective layer.

This invention also relates to a device having a carrying body moveable relative to the assembly carrier and the portion of which facing the protective layer carries the wafer and has flow apertures for the medium. According to a further advantageous embodiment of this invention, this portion is preferably configured planar and the flow apertures are formed as centrally located ducts and circular grooves/ducts close to the edge. Here the ducts with their air supply lines arch the wafer by excess pressure and the grooves have extraction lines so that negative pressure keeps the wafer at its edges and deposits the same.

A further embodiment of this invention provides this portion in a preferably shaped circular, when viewed from above. However, other shapes are also possible, for example an oval or a polygonal shape.

The method makes it possible to provide the active side of the wafer with a protective layer and to minimize the possible inclusion of air bubbles. Thus in the following working step, the rear side of the wafer is not impaired by unevenness. With the method of this invention it is possible to optimize the reduction of the wafer thickness.

Furthermore through a favorable initial position of the surface, possible damage, such as microcracks, can be reduced.

DESCRIPTION OF PREFERRED EMBODIMENTS

Figure 1:
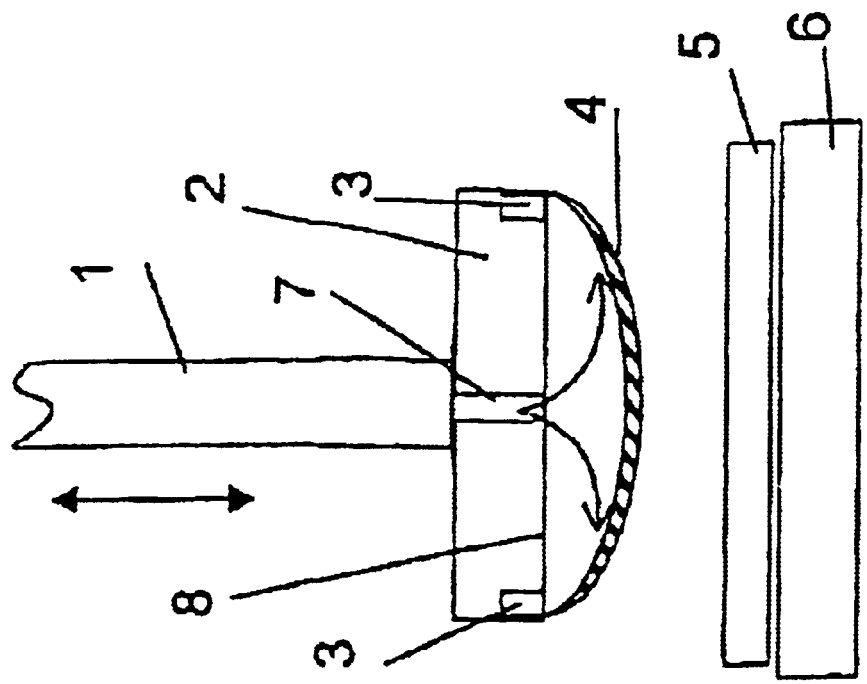

FIGS. 1 to 4 show four steps of a chronological progression of the method for applying the active side of the substrate or wafer 4 into the protective layer 5. The initial phase of the process is shown in FIG. 1. The feed arm 1 guides the carrying body 2 in a linear movement to the assembly carrier 6, to which the prepared protective layer 5, such as a wax, is applied. The carrying body 2 has a lower portion 8 which can have a shape, when viewed from above, of one of circular, oval and polygonal. The carrying body 2 has on its lower portion 8 one or a plurality of preferably central open ducts, each of which is supplied with excess pressure by a pressure medium, such as air or another fluid.

Groove-shaped flow apertures 3, 7, through which the medium is extracted, are attached in an arc on the periphery of the lower portion 8. This negative pressure in the initial phase holds and fixes the wafer 4 at the edges of its rear side. As soon as sufficient retention force is achieved by suction, overpressure is actuated concentrically via the flow apertures 3, 7. This overpressure causes the wafer 4 to arch outwards but does not exceed the retention force through the effect of suction on the edge of the wafer 4. The wafer 4 is thus changed in its spatial shape but is still fixed centrally. In this static state, the wafer 4 is gradually moved towards the assembly carrier 6 with the protective layer 5.

Figure 2:
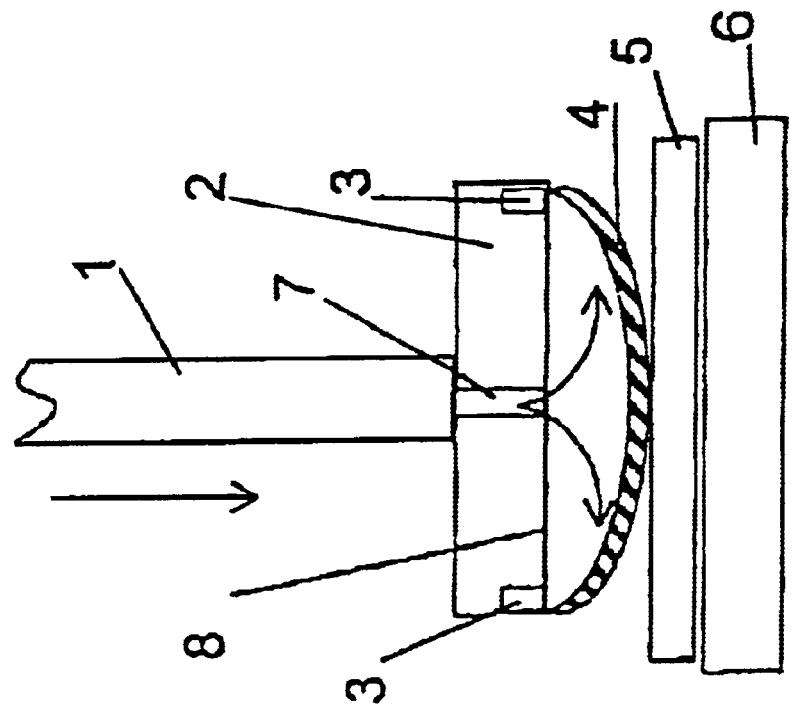
FIGS. 1–4 each show a partial cross-sectional diagrammatic view of a different step of the method according to this invention.

FIG. 2 shows that the wafer 4 has reached its destination, the protective layer 5. This phase is detected by a corresponding sensor analysis and the feeding speed is reduced so that the protruding portion of the arched wafer 4 positively contacts the protective layer 5 but no significant deformations arise from immersion.

Figure 3:
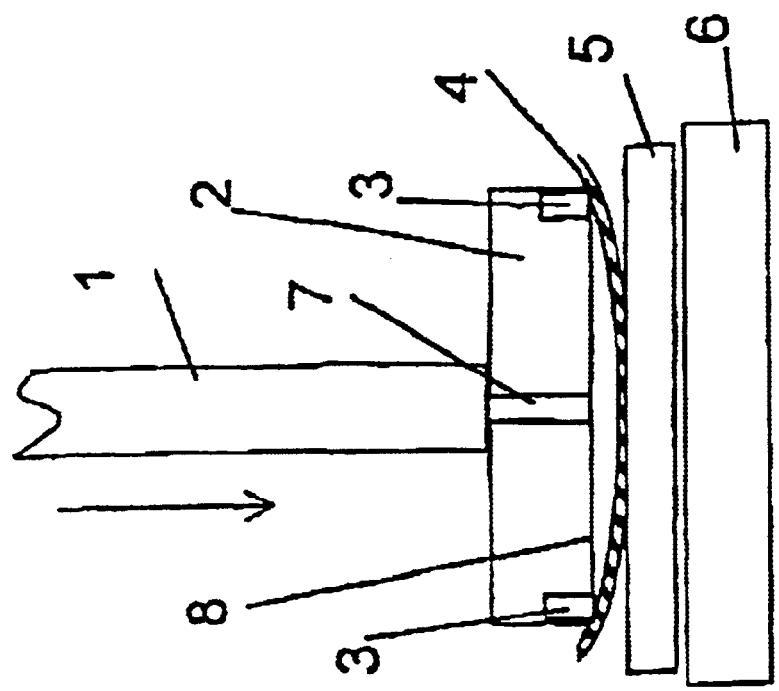

FIG. 3 shows a correlation between recovery of the arched wafer 4 and the remaining supply path and how it takes place. The excess pressure in the flow aperture is taken back, the wafer 4 returns to its original shape and simultaneously, through further advance via the feed arm 1, a practically constant contact pressure between the active side of the wafer 4 and the protective layer 5 is provided. During a phase of reforming the wafer 4, the surface of the wafer 4 unrolls uniformly from the central set-down point towards the edges and, as it thus spreads, systematically pushes air bubbles in front of it towards the edge.

Figure 4:
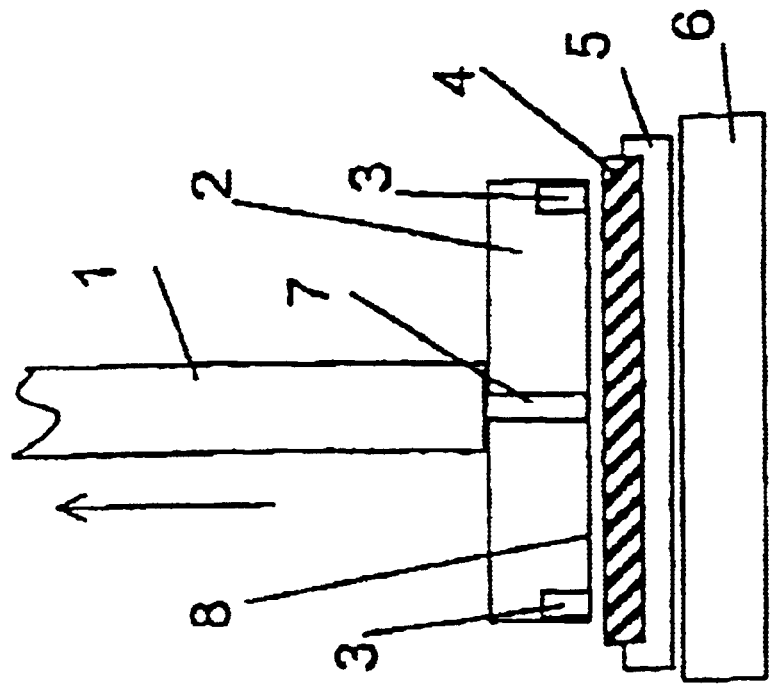

FIG. 4 shows the end phase of applying into the protective layer 5. The wafer 4 is returned completely to its flat shape and rests in the protective layer 5 parallel to the assembly carrier 6. The negative pressure in the flow apertures to hold the wafer 4 is removed, the wafer 4 detaches itself from the carrying body 2, which then travels back. The wafer 4 could also be secured to the assembly carrier 6 in an electrostatic manner.

What is claimed is:

1. A method for applying a thin-walled, planar semiconductor wafer to a planar assembly carrier (6) with a protective layer (5), the improvement comprising:
   with respect to the protective layer (5), arranging the wafer at a spacing and curved in a convex manner, contacting the protective layer (5) with the wafer (4), and laying the wafer (4) over the protective layer (5) from a contact point towards an edge of the wafer, and the wafer being arched and detached from a carrying body (2) by controlling a pressure of a medium in a cavity between the wafer (4) and the carrying body (2);
   the carrying body (2) moveable relative to the assembly carrier (6) and including a planar portion (8) facing the protective layer (5) and carrying the wafer (4), the portion (8) having a plurality of flow apertures (3, 7) for accommodating the pressure medium, the flow apertures (3, 7) including at least one centrally formed duct (7) configured as an overpressure line for arching the wafer (4) and circumferential grooves (3) configured as negative pressure lines for releasably attaching the wafer (4) to the carrying body (2).

2. The method according to claim 1, wherein a pressure medium is applied to a side of the wafer (4) remote from the protective layer (5).

3. The method according to claim 1, wherein the portion (8) is one of circular, oval and polygonal in cross-section when viewed from above.

4. The method according to claim 1, wherein when laid the wafer (4) applies a constant pressure on the protective layer (5).

5. The method according to claim 4, wherein a pressure medium is applied to a side of the wafer (4) remote from the protective layer (5).

6. The method according to claim 4, wherein the portion (8) is one of circular, oval and polygonal in cross-section when viewed from above.

* * * * *